United States Patent [19]
Nilssen

[11] Patent Number: 5,189,342
[45] Date of Patent: Feb. 23, 1993

[54] PARALLEL-TUNED ELECTRONIC BALLAST

[76] Inventor: Ole K. Nilssen, Caesar Dr., Barrington, Ill. 60010

[21] Appl. No.: 840,528

[22] Filed: Feb. 25, 1992

Related U.S. Application Data

[63] Continuation of Ser. No. 646,497, Jan. 28, 1991, abandoned, which is a continuation of Ser. No. 107,795, Oct. 13, 1987, abandoned, which is a continuation-in-part of Ser. No. 658,423, Oct. 5, 1984, abandoned.

[51] Int. Cl.[5] ................................. 315 226; 315 244; 315 DIG. 7; H05B 41/29
[52] U.S. Cl. ................................................ 315/209 R
[58] Field of Search .............. 315/209 R, 243, 244, 315/DIG. 5, DIG. 7, 226; 363/17, 58, 132

[56] References Cited

U.S. PATENT DOCUMENTS

| | | | |
|---|---|---|---|
| 3,155,875 | 11/1964 | Wenrich et al. | 315/DIG. 5 |
| 3,340,458 | 9/1967 | Keller | 333/177 X |
| 3,341,737 | 9/1967 | Rosa | 315/209 R X |
| 3,800,210 | 3/1974 | Caussin | 333/177 X |
| 4,277,726 | 7/1981 | Burke | 315/98 |
| 4,307,353 | 12/1981 | Nilssen | 331/113 A |
| 4,469,988 | 9/1984 | Cronin | 315/DIG. 5 X |
| 4,692,667 | 9/1987 | Nilssen | 315/DIG. 7 X |

FOREIGN PATENT DOCUMENTS 0982163 12/1982 U.S.S.R. .

*Primary Examiner*—David Mis

[57] ABSTRACT

Power to a self-oscillating inverter ballast is supplied from a DC voltage source through an inductor means having two separate windings on a common magnetic core—with one winding being positioned in each leg of the power supply. The inverter is loaded by way of a parallel-tuned L-C circuit connected across the inverter's output, thereby providing a sinusoidal voltage thereat. A fluorescent lamp is connected by way of a current-limiting capacitor with the inverter's output.

19 Claims, 1 Drawing Sheet

PARALLEL-TUNED ELECTRONIC BALLAST

RELATED APPLICATIONS

This application is a continuation of Ser. No. 07/646,497 filed Jan. 28, 1991, now abandoned; which is a continuation of Ser. No. 07/107,795 filed Oct. 13, 1987, now abandoned; which was a continuation-in-part of Ser. No. 06/658,423 filed Oct. 5, 1984, now abandoned.

BACKGROUND OF THE INVENTION

1. Field of Invention

The present invention relates to a self-oscillating parallel-tuned transistor inverter ballast, particularly of a kind that comprises bridge-type inverter means.

2. Description of Prior Art

Although self-oscillating parallel-tuned transistor inverter ballasts do presently exist—as for instance described in U.S. Pat. No. 4,277,726 to Burke—bridge-type inverters of that type do not presently exist.

SUMMARY OF THE INVENTION

Objects of the Invention

An object of the present invention is that of providing a self-oscillating inverter ballast for powering a gas discharge lamp means.

Another object is that of providing an inverter ballast that is particularly cost-effective, efficient and versatile in use.

These, as well as other important objects and advantages of the present invention will become apparent from the following description.

BRIEF DESCRIPTION

In its preferred embodiment, subject invention is a full-bridge inverter comprising four switching transistors and being symmetrically powered from a center-tapped DC voltage source through an inductor means having two windings on a single magnetic core—with one winding positioned in each leg of the DC source. This full-bridge inverter has a center-tapped parallel-resonant L-C circuit connected across its output, and is made to self-oscillate by way of two positive feedback current-transformers, each connected in series with the center-tapped L-C circuit and a fluorescent lamp load connected thereto.

The outputs from the current-transformers are applied to the control terminals of the four switching transistors, thereby providing load-proportional drive to these transistors.

The center-tapped DC voltage source, the inductor means and the full-bridge inverter circuit with its two feedback current-transformers are connected together in symmetrical fashion; which provides for the center-tap of the inverter output to be at the same potential as the center-tap of the DC voltage source. Thus, since the center-tap of the DC source is grounded, the center-tap of the inverter's output is grounded as well; which, in turn, implies that any load connected to the inverter's output is symmetrically referenced to ground.

The feedback current-transformers are saturable and so designed as to saturate approximately at the time the inverter's output voltage reaches zero magnitude.

A Zener-type voltage-limiting device is connected directly between the inverter's DC power input terminals, thereby to protect the transistors from voltage transients of excessive magnitude.

The fluorescent lamp means is connected with the inverter's output by way of a current-limiting capacitor.

DESCRIPTION OF THE PREFERRED EMBODIMENT

Details of Construction

Figure 1:
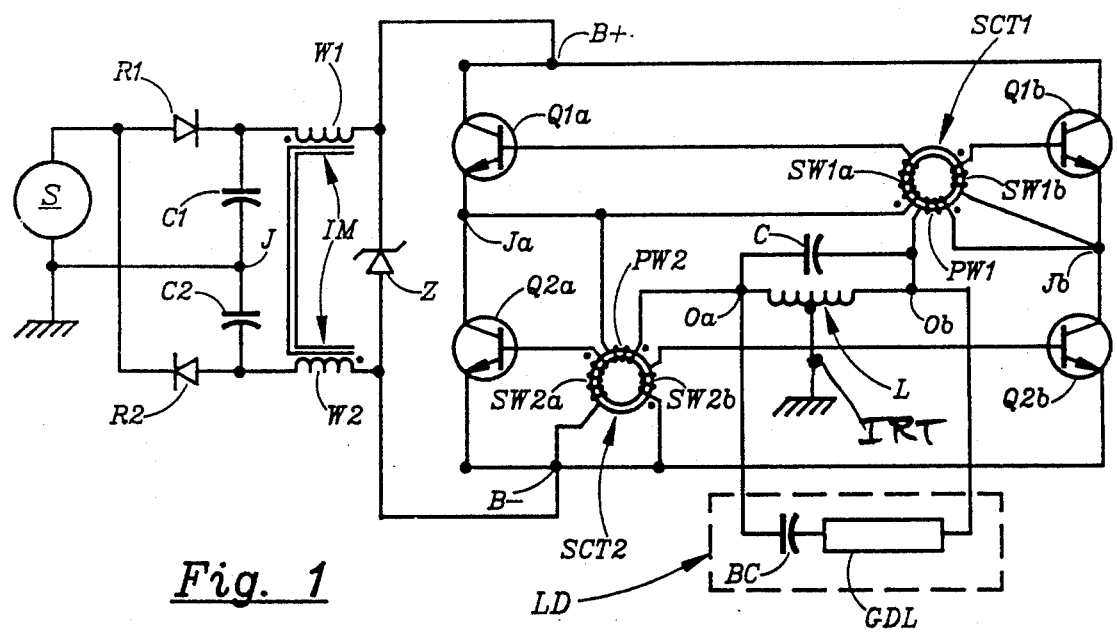
FIG. 1 schematically illustrates the preferred embodiment of the invention.

FIG. 1 shows an AC power supply S, which in reality is an ordinary 120 Volt/60 Hz electric utility power line.

One terminal of power supply S is grounded and also directly connected to a junction J between two energy-storing capacitors C1 and C2. The other terminal of power supply S is connected to the anode of a rectifier R1 and to the cathode of a rectifier R2. Rectifier R1 has its cathode connected to one terminal of C1—the other terminal of C1 being connected to junction J. Rectifier R2 has its anode connected to one terminal of C2—the other terminal of C2 being connected to junction J.

An inductor means IM has two equal but separate windings W1 and W2: W1 is connected between the cathode of rectifier R1 and a junction B+ between the collectors of two transistors Q1a and Q1b; W2 is connected between the anode of R2 and a junction B− between the emitters of two transistors Q2a and Q2b.

A Zener diode Z is connected between junction B+ and junction B−.

Transistor Q1a is connected with its emitter to a junction Ja, as is also the collector of transistor Q2a. Transistor Q1b is connected with its emitter to a junction Jb, as is also the collector of transistor Q2b.

A center-tapped inductor L is connected between inverter output terminals Oa and Ob. Connected in parallel with L is a capacitor C. The center-tap on inductor L, which is referred-to as inverter reference terminal IRT, is grounded.

Primary winding PW1 of saturable current-transformer SCT1 is connected between junction Jb and output terminal Ob. Primary winding PW2 of saturable current-transformer SCT2 is connected between junction Ja and output terminal Oa.

One secondary winding SW1a of transformer SCT1 is connected between the base and the emitter of transistor Q1a; another secondary winding SW1b of transformer SCT1 is connected between the base and the emitter of transistor Q1b.

One secondary winding SW2a of transformer SCT2 is connected between the base and the emitter of transistor Q2a; another secondary winding SW2b of transformer SCT2 is connected between the base and the emitter of transistor Q2b.

A series-combination of a ballasting capacitor BC and a gas discharge lamp GDL constitutes a load LD; which load is connected across output terminals Oa and Ob.

DETAILS OF OPERATION

The operation of the full-bridge inverter circuit of FIG. 1 may be explained as follows.

Source S provides 120 Volt/60 Hz voltage to the voltage-doubling and rectifying/filtering circuit consisting of R1, R2, C1 and C2. A substantially constant DC voltage of about 320 Volt magnitude then results at the output of this circuit, with the positive side of this DC voltage being present at the cathode of R1 and the negative side being present at the anode of R2.

This substantially constant-magnitude DC voltage is applied by way of inductor means IM and its two windings W1 and W2, poled as indicated, to the DC power input terminals B+ and B− of the full-bridge inverter circuit comprising transistors Q1a, Q1b, Q2a and Q2b.

This inverter circuit is made to self-oscillate by way of positive current feedback provided by saturable current-transformers SCT1 and SCT2, poled as indicated. Thus, the magnitude of the current provided to any given transistor's base-emitter junction is proportional to the magnitude of the current flowing between output terminals Oa and Ob.

The frequency of inverter oscillation is determined by a combination of the saturation characteristics of the saturable current-transformers and the natural resonance frequency of the parallel L-C circuit (as combined with any tuning effects caused by the load connected thereacross).

The saturation characteristics of the saturable current-transformers are substantially identical to one another and so chosen that, when there is no load connected across output terminals Oa and Ob, the waveform of the output voltage is as indicated in FIG. 2a; which waveform is made up of sinusoidal half-waves of voltage, indicated by HW1 and HW2, interconnected with periods of zero-magnitude voltage, indicated by ZM1 and ZM2. This waveform is achieved by making the time-length of the saturation-time required for the saturable current-transformers to reach saturation longer than the time-length of one of the sinusoidal half-waves of voltage. The degree to which the time-length of the saturation-time is longer than the time-length of one of the sinusoidal half-waves of voltage corresponds to the time-length of the periods of zero-magnitude voltage.

In FIG. 2a, each of the sinusoidal half-waves of voltage represents the natural interaction between L and C as fed from a substantially constant current source.

In combination, the two separate but equal windings W1 and W2 of inductor means IM provide for a total inductance that is large enough so that the current flowing through the two windings and into the inverter remains substantially constant during a complete time-period of one cycle of the inverter's oscillation.

That is, the DC current flowing into the B+ junction and out of the B− junction is substantially constant during the interval between point X and point Y in FIG. 2a. Thus, whenever the L-C parallel circuit is connected between B+ and B−—which it is during the complete time-length of each of the sinusoidal half-waves of voltage—it is indeed fed from a substantially constant current source.

When a load impedance having a net component of capacitive reactance (such as does LD) is connected across the inverter's output terminals Oa and Ob, capacitive reactance is in effect added to the L-C parallel circuit; which results in the time-lengthening of the sinusoidal half-waves of voltage—as indicated by FIG. 2b. The more capacitance added this way, the more time-lengthening results.

On the other hand, when a load impedance having a net component of inductive reactance is connected between Oa and Ob, the result would be a time-shortening of the sinusoidal half-waves of voltage.

By having two different load impedances connected between Oa and Ob, and by having these two load impedances be of conjugate nature, there will be no net effect on the length of the period of the sinusoidal half-waves. For instance, by having another gas discharge lamp like GDL connected in series with an inductor having a reactance of the same absolute magnitude as that of BC, and by connecting this series-combination in parallel with load LD, the total net load impedance would be resistive and would cause no net shortening or lengthening of the sinusoidal half-waves of voltage.

By making the time-length of the saturation-time of the saturable current-transformers substantially equal to the time-length of one of the sinusoidal half-waves of voltage, the resulting output voltage will be as illustrated in FIG. 2c; which indicates that the net inversion frequency will now be the same as the natural resonance frequency of the L-C parallel circuit (as combined with whatever load impedance might be connected between Oa and Ob).

By making the time-length of the saturation-time of the saturable current-transformers shorter than the time-length of one of the sinusoidal half-waves of voltage, the resulting output voltage will be as illustrated in FIG. 2d; which indicates that the net inversion frequency will now be higher then the natural resonance frequency of the L-C circuit (as combined with whatever load impedance might be connected between Oa and Ob).

ADDITIONAL COMMENTS (a) As long as the time-length of the saturation-time of the saturable current-transformers remains equal to or longer than the time-length of one of the sinusoidal half-waves of voltage, the net inversion frequency will not be affected by the addition or removal of a load impedance, such as LD of FIG. 1, regardless of the magnitude of the net reactive impedance thereby added to or subtracted from the L-C parallel circuit.

(b) The magnitude of the Zener voltage of Zener diode Z is chosen such as to be somewhat higher than the maximum magnitude of the peak voltage of the sinusoidal half-waves of voltage present across the inverter's output terminals Oa and Ob. That way, the Zener diode will not interfere with normal operation of the inverter; yet, it will prevent the magnitude of the peak voltages of the sinusoidal half-waves from substantially exceeding the normally occurring maximum magnitudes. Without the Zener diode, for various transient reasons (such as due to the sudden removal of a load) the magnitude of the peak voltages of the sinusoidal half-waves would occasionally become substantially larger than the normally occurring maximum magnitudes; and that would either cause transistor destruction, or it would necessitate the use of very special transistors of exceptionally high voltage capabilities.

(c) Inductor L is center-tapped; which, in effect, provides for a center-tap between the inverter's output terminals Oa and Ob. This center-tap is grounded. In many applications, particularly in the case of fluorescent lamp ballasts, it is very valuable to have the output referenced to ground.

(d) Inductor L may be integrally combined with a center-tapped auto-transformer; in which case the output voltage can readily be provided at any desired magnitude, while maintaining a ground-connected center-tap.

(e) Inductor means IM may consist of two entirely independent inductors—with one inductor located in each leg of the power supply. In fact, it is even acceptable under some circumstances to use but a single inductor in just one leg of the power supply; in which case, however, it would not be possible to connect the output's center-tap with the power supply's center-tap.

(f) It is not necessary to power the inverter of FIG. 1 from a voltage doubler. However, doing so provides for the advantage in many situations of being able to reference the center-tap of the inverter's output with one of the legs of the power line.

(g) The inverter of FIG. 1 must be triggered into oscillation. This triggering may be accomplished by way of providing a special trigger winding on each of the feedback current-transformers, and then to discharge a capacitor through these trigger windings. This may be done automatically with an arrangement consisting of a capacitor-resistor combination connected between B+ and B−, and a Diac for discharging the capacitor through the trigger windings.

(h) Finally, it is noted that the average absolute magnitude of the AC voltage appearing between inverter output terminals Oa and Ob must be substantially equal to the magnitude of the DC voltage provided from across the two series-connected energy-storing capacitors C1 and C2.

Or, stated differently, in the circuit of FIG. 1, if the inverter's AC output voltage as provided between terminals Oa and Ob were to be rectified in a full-wave rectifier, the average magnitude of the DC voltage obtained from this full-wave rectifier would have to be substantially equal to the magnitude of the DC voltage supplied from the DC output of the rectifier/filter combination consisting of R1, R2, C1 and C2.

This relationship would have to exist substantially regardless of the nature of the load connected between the inverter's output terminals.

(i) Although the full-bridge inverter circuit of FIG. 1 may be designed to invert at any one of a wide range of frequencies, in the preferred embodiment the inversion frequency is approximately 30 kHz. Thus, the time-length of the interval between point X and point Y of FIG. 2a is about 33 micro-seconds.

Figure 2:
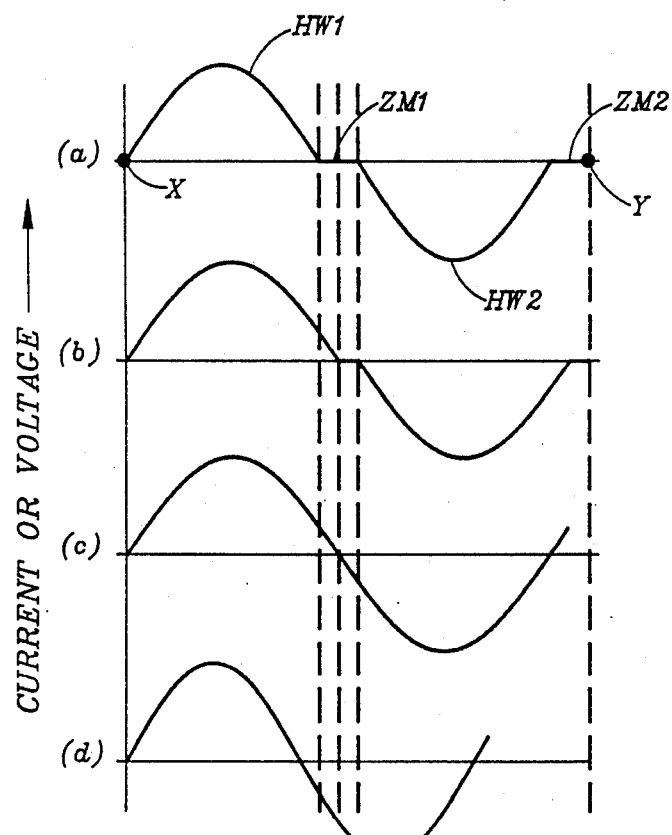
FIG. 2 shows various voltage waveforms associated with the preferred embodiment of the invention.

(j) The waveforms of FIG. 2 depict the voltage present between output terminals Oa and Ob under different operating conditions. Of course, the voltage present between Oa and inverter reference terminal IRT is equal to half the voltage present between terminals Oa and Ob.

(k) Due to the balanced nature of the inverter and its DC power supply, with reference to any one of the terminals of filter capacitors C1 and C2, any high frequency voltage present at inverter reference terminal IRT—even if it were not connected with ground—would have negligible magnitude.

(l) The primary windings of saturable current transformers SCT1 and SCT2 have fewer turns than do the secondary windings. Typically, the transistors operate with a 1:4 primary-to-secondary turns ratio; which corresponds to a forced current gain of four. At that turns ratio, the magnitude of the voltage developing across the primary winding of each of the saturable current transformers is only one fourth of the magnitude of the base-emitter voltage; which, of course, is only about 0.8 Volt.

In other words, the magnitude of the voltage developing across the primary winding of each staturable transformer is only about 0.2 Volt; which, of course, represents a magnitude that is totally negligible in comparisn with the magnitude of the voltage developing between output terminals Oa and Ob.

Thus, the voltage at terminal Ob is substantially equal to the voltage at terminal Jb; and the voltage at terminal Oa is substantially equal to the voltage at terminal Ja.

(m) It is believed that the present invention and its several attendant advantages and features will be understood from the preceeding description. However, without departing from the spirit of the invention, changes may be made in its form and in the construction and interrelationships of its component parts, the form herein presented merely representing the presently preferred embodiment.

I claim:

1. A ballast for a gas discharge lamp, comprising:
a source operative, between a first and a second DC output terminal, to provide a DC voltage of substantially constant magnitude; and
inverter-type power supply connected with the DC output terminals and operative to provide a high-frequency AC voltage between a first inverter output terminal and an inverter reference terminal; the high-frequency AC voltage being of a certain magnitude and a certain frequency; the certain frequency being substantially higher than the frequency of the power line voltage on an ordinary electric utility power line; the power supply including a tuned L-C circuit connected with the first inverter output terminal and the inverter reference terminal; the L-C circuit having a tank capacitor parallel-connected with a tank inductor and being resonant at or near said certain frequency; any high-frequency voltage existing between the inverter reference terminal and the first DC output terminal being of magnitude negligible in comparison with said certain magnitude.

2. The ballast of claim 1 wherein, between the first DC output terminal and the inverter reference terminal, there exists a short circuit for currents of said certain frequency.

3. The ballast of claim 1 wherein the power supply includes two transistors series-connected across a pair of inverter DC input terminals.

4. The ballast of claim 1 wherein the power supply includes: (i) a first and a second DC input terminal; and (ii) current-limiting inductor means connected in circuit between the DC input terminals and the DC output terminals.

5. The ballast of claim 4 wherein the current-limiting means includes an inductor having a first and a second winding; the first winding being connected between the first DC output terminal and the first DC input terminal; the second winding being connected between the second DC output terminal and the second DC input terminal.

6. The ballast of claim 1 wherein: (i) the power supply has a second inverter output terminal; and (ii) a voltage of magnitude and frequency equal to that of the high-frequency AC voltage exists between the second inverter output terminal and the inverter reference terminal.

7. The combination of claim 1 wherein the high-frequency AC voltage consists of periodically repeating voltage cycles, with each voltage cycle having a complete cycle period and including: (i) a sinusoidally-shaped negative voltage pulse; (ii) a sinusoidally-shaped positive voltage pulse; and (iii) a period of zero-magnitude voltage connecting each voltage pulse;

the combination being functional such that:
(a) the duration of each negative voltage pulse is approximately equal to that of each positive voltage pulse; and
(b) the duration of each period of zero-magnitude voltage is shorter than the duration of each voltage pulse.

8. The combination of claim 7 wherein the duration of each period of zero-magnitude voltage represents a significant fraction of the duration of each voltage pulse.

9. The combination of claim 7 wherein the duration of each period of zero-magnitude voltage represents more than about one tenth the duration of each voltage pulse.

10. An arrangement comprising:
a source operative to provide, between a first and a second DC output terminal, a DC voltage of substantially constant magnitude;
inverter-type power supply connected with the DC output terminals and operative to provide a first high-frequency AC output voltage between a first inverter output terminal and an inverter reference terminal; the first high-frequency AC output voltage being of a certain magnitude and of a certain frequency; the certain frequency being substantially higher than the frequency of the power line voltage on an ordinary electric utility power line; the power supply including an L-C circuit connected with the first inverter output terminal and the inverter reference terminal; the L-C circuit having a capacitor parallel-connected with an inductor; the parallel-connected capacitor and inductor being resonant at or near said certain frequency; any high-frequency voltage existing between the inverter reference terminal and the first DC output terminal being of magnitude negligible in comparison with said certain magnitude; and
gas discharge lamp connected in circuit with the first inverter output terminal and the inverter reference terminal by way of a reactive current-limiting means.

11. The arrangement of claim 10 wherein: (i) the power supply has a second inverter output terminal; (ii) a second high-frequency AC output voltage exists between the inverter reference terminal and the second inverter output terminal; and (iii) the magnitude and the frequency of the second high-frequency AC output voltage are substantially equal to those of the first high-frequency AC output voltage.

12. An arrangement comprising:
a source operative to provide, between a first and a second DC output terminal, a DC voltage of substantially constant magnitude;
inverter-type power supply having a first and a second DC input terminal; the DC input terminals being connected with the DC output terminals by way of a current-limiting inductor means; the power supply being operative to provide a first high-frequency AC output voltage between a first inverter output terminal and an inverter reference terminal; the first high-frequency AC output voltage being of a certain magnitude and a certain frequency; the certain frequency being substantially higher than the frequency of the power line voltage on an ordinary electric utility power line; the power supply including an L-C circuit connected with the first inverter output terminal and the inverter reference terminal; the L-C circuit having a capacitor parallel-connected with an inductor; the parallel-connected capacitor and inductor being resonant at or near said certain frequency; any high-frequency voltage existing between the inverter reference terminal and the first DC output terminal being of magnitude negligible in comparison with said certain magnitude; and
gas discharge lamp connected in circuit with the first inverter output terminal and the inverter reference terminal by way of a current-limiting means.

13. The arrangement of claim 12 wherein the power supply is characterized by including: (i) a junction; (ii) a first transistor connected between the junction and the first DC input terminal; and (iii) a second transistor connected between the junction and the second DC input terminal.

14. A ballast for a gas discharge lamp, comprising:
a DC source operative to provide, between a pair of DC output terminals, a DC voltage of substantially constant magnitude; the DC source having a reference terminal; and
inverter circuit connected with the reference terminal as well as with the DC output terminals; the inverter circuit being characterized by: (i) including a periodically conducting transistor having a transistor output terminal; (ii) including a tuned L-C circuit connected in circuit with the transistor output terminal as well as with the reference terminal, which tuned L-C circuit has a tank capacitor parallel-connected with a tank inductor and is resonant at or near a given frequency; and (iii) being operative to provide a high-frequency AC voltage between the reference terminal and the transistor output terminal; the high-frequency AC voltage being of a certain waveform and a certain frequency; the certain waveform being, at least under some circumstances, substantially sinusoidal; the certain frequency being about equal to said given frequency and substantially higher than the frequency of the power line voltage on an ordinary electric utility power line.

15. The ballast of claim 14 wherein, for currents of frequency about equal to said certain frequency, a short short circuit effectively exists between the reference terminal and either of the DC output terminals.

16. The ballast of claim 14 wherein the inverter circuit is further characterized by drawing a DC current from the the DC source, with the instantaneous magnitude of the DC current being substantially constant during each complete period of the AC voltage.

17. A ballast for a gas discharge lamp, comprising:
a DC source operative to provide, between a pair of DC output terminals, a DC voltage of substantially constant magnitude; the DC source having a reference terminal; and
inverter circuit connected with the reference terminal as well as with the DC output terminals; the inverter circuit being characterized by: (i) including a periodically conducting transistor having a transistor output terminal; (ii) including a tuned L-C circuit connected in circuit with the transistor output terminal as well as with the reference terminal, which tuned L-C circuit has a tank capacitor parallel-connected with a tank inductor and is resonant at or near a given frequency; and (iii) being operative to provide a high-frequency AC voltage between the reference terminal and the transistor output terminal; the high-frequency AC voltage being of a certain waveform and a certain frequency; the certain frequency being about equal to said given frequency and substantially higher than the frequency of the power line voltage on an ordinary electric utility power line; the certain waveform consisting of periodically repeating voltage cycles, with each voltage cycle having a complete cycle period consisting of: (i) a sinusoidally-shaped negative voltage pulse; (ii) a sinusoidally-shaped positive voltage pulse; and (iii) a period of zero-magnitude voltage connecting each voltage pulse.

18. The ballast of claim 17 wherein said period of zero-magnitude voltage is so short as to make said certain waveform substantially sinusoidal.

19. An arrangement comprising:
a DC source operative to provide, between a pair of DC output terminals, a DC voltage of substantially constant magnitude; the DC source having a DC reference output terminal whose potential is substantially constant with respect to either of the two DC output terminals;

inverter-type power supply having a pair of DC input terminals connected with the DC output terminals by way of a current-limiting inductor means; the power supply also: (i) having a DC reference input terminal connected with the DC reference output terminal; (ii) including a periodically conducting transistor having a transistor output terminal; and (iii) being operative to provide an AC output voltage between the DC reference input terminal and the transistor output terminal; the AC output voltage being of a certain waveform and a certain frequency; the certain frequency being substantially higher than the frequency of the power line voltage on an ordinary electric utility power line; the waveform being, at least under some circumstances, substantially sinusoidal; the power supply including an L-C circuit connected in circuit with the transistor output terminal and the DC reference terminals; the L-C circuit having a capacitor parallel-connected with an inductor; the parallel-connected capacitor and inductor being resonant at or near said certain frequency; and gas discharge lamp connected with the L-C circuit by way of a current-limiting means.

* * * * *

(12) EX PARTE REEXAMINATION CERTIFICATE (6111th)
United States Patent
Nilssen

(10) Number: US 5,189,342 C1
(45) Certificate Issued: Feb. 5, 2008

(54) PARALLEL-TUNED ELECTRONIC BALLAST

(76) Inventor: Ole K. Nilssen, Caesar Dr., Barrington, IL (US) 60010

Reexamination Request:
No. 90/007,551, May 20, 2005

Reexamination Certificate for:
Patent No.: 5,189,342
Issued: Feb. 23, 1993
Appl. No.: 07/840,528
Filed: Feb. 25, 1992

Related U.S. Application Data

(63) Continuation of application No. 07/646,497, filed on Jan. 28, 1991, now abandoned, which is a continuation of application No. 07/107,795, filed on Oct. 13, 1987, now abandoned, which is a continuation-in-part of application No. 06/658,423, filed on Oct. 5, 1984, now abandoned.

(51) Int. Cl.
*H05B 41/14* (2006.01)

(52) U.S. Cl. .................. 315/209 R; 315/226; 315/244; 315/DIG. 7

(58) Field of Classification Search ............. 315/209 R, 315/226, 244, 243; 363/17, 58, 132
See application file for complete search history.

(56) References Cited

U.S. PATENT DOCUMENTS

| | | | |
|---|---|---|---|
| 2,333,499 A | 11/1943 | Warren | |
| 2,990,519 A | 6/1961 | Wagner | |
| 3,317,856 A | 5/1967 | Wilkinson | |
| 3,341,737 A | 9/1967 | Rosa | |
| 3,733,541 A | 5/1973 | Elms | |
| 4,071,812 A | 1/1978 | Walker | |
| 4,251,752 A | 2/1981 | Stolz | |
| 4,266,134 A | 5/1981 | Franke | |
| 4,277,726 A | 7/1981 | Burke | 315/98 |
| 4,277,728 A | 7/1981 | Stevens | |
| 4,330,819 A | 5/1982 | Foch et al. | |
| 4,392,087 A | 7/1983 | Zansky | |
| 4,460,949 A | 7/1984 | Steigerewald | |
| 4,461,980 A | 7/1984 | Nilssen | |
| 4,504,895 A | 3/1985 | Steigerewald | |
| 4,692,667 A | 9/1987 | Nilssen | |
| 5,055,746 A | 10/1991 | Hu | |
| 5,204,587 A | 4/1993 | Mortimer | |

FOREIGN PATENT DOCUMENTS

| | | |
|---|---|---|
| DE | 29 45 245 A1 | 5/1980 |
| EP | 0 059 064 B1 | 10/1985 |
| FR | 71.45051 | 8/1973 |
| FR | 2441 290 A1 | 6/1980 |
| FR | 2441290 A1 | 6/1980 |
| GB | 2 038 570 A1 | 7/1980 |
| JP | 52-100769 | 8/1977 |
| JP | 53-085976 | 7/1978 |
| JP | 55-117474 | 9/1980 |
| JP | 59-153473 | 1/1984 |
| JP | 59-203395 | 11/1984 |

OTHER PUBLICATIONS

Memorandum Opinion and Order—Judge John W. Darrah (Jun. 28, 2006); *Nilssen v. Osram* (01 C 3585).

Hirschmann, W., Technische Mitteilung aus dem Bereich Bauelemente, (Siemens AG) (1978) (excerpted pages).

Rule 26(A)(2)(B) Expert Report of Robert Burke (Jul. 11, 2005); *Nilssen v. Universal Lighting Technologies, Inc.* (Civil Case No. 3:04–0080).

(Continued)

*Primary Examiner*—Ovidio Escalante

(57) ABSTRACT

Power to a self-oscillating inverter ballast is supplied from a DC voltage source through an inductor means having two separate windings on a common magnetic core—with one winding being positioned in each leg of the power supply. The inverter is loaded by way of a parallel-tuned L-C circuit connected across the inverter's output, thereby providing a sinusoidal voltage thereat. A fluorescent lamp is connected by way of a current-limiting capacitor with the inverter's output.

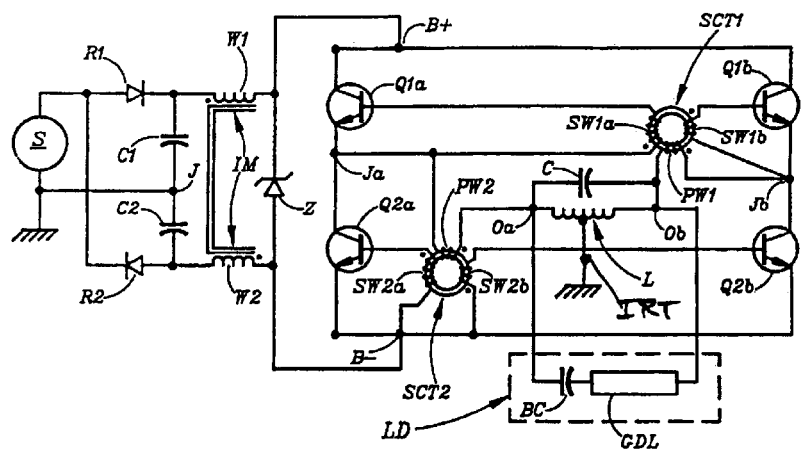

OTHER PUBLICATIONS

Rule 26(A)(2)(B) Expert Report of Carlile R. Stevens (Jul. 11, 2005); *Nilssen* v. *Universal Lighting Technologies, Inc.* (Civil Case No. 3:04–0080).

C.J. Yarrow, "Transistor Converters for the Generation of High Voltage Low–Current D.C. Supplies." (May 1959).

Rule 26(A)(2)(B) Expert Report of Carlile R. Stevens (Nov. 13, 2003); *Nilssen* v. *Osram Sylvania, Inc.* (C.A. No. 01–C–3835).

Declaration of C.R. Stevens in Support of Motorola's Motion for Summary Judgment (Jul. 28, 2000); *Nilssen* v. *Motorola, Inc.* (C.A. No. 96 C 5571).

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–19 is confirmed.

* * * * *